United States Patent [19]

Azam et al.

[11] Patent Number: 4,860,103

[45] Date of Patent: Aug. 22, 1989

[54] VIDEO LEVEL CONTROL

[75] Inventors: Mohammad S. Azam; Michael D. Carr, both of Ipswich, England

[73] Assignee: British Telecommunications plc, London, England

[21] Appl. No.: 275,658

[22] Filed: Nov. 22, 1988

Related U.S. Application Data

[63] Continuation of Ser. No. 917,158, Oct. 9, 1986, abandoned.

[30] Foreign Application Priority Data

Oct. 9, 1985 [GB] United Kingdom ................. 8524880

[51] Int. Cl.⁴ ............................................. H04N 5/14
[52] U.S. Cl. .................................... 558/160; 358/141
[58] Field of Search ............... 358/160, 141, 13, 21 R, 358/903, 169, 163; 382/50, 51, 53; 341/155, 120, 139

[56] References Cited

U.S. PATENT DOCUMENTS 4,625,240 11/1986 Yablonski et al. .................. 358/174
4,628,362 12/1986 Waehner .............................. 358/174
4,642,694 2/1987 Yamagishi et al. ................. 358/160

FOREIGN PATENT DOCUMENTS 0083865 7/1983 European Pat. Off. .
0178044 of 1986 European Pat. Off. .
0006994 1/1986 Japan ................... 358/21 R
0081815 4/1987 Japan ................... 358/141
2130839 6/1984 United Kingdom .

Primary Examiner—James J. Groody
Assistant Examiner—David E. Harvey
Attorney, Agent, or Firm—Nixon & Vanderhye

[57] ABSTRACT

An analog-to-digital converter 2 for video signals has a sensitivity (reference) input 4 controlled by a controller 10 in response to the converter's digital output so as to maintain the grey level with a predetermined range. Preferably the controller employs an irregular subsampling of the digital values, and responds differently to extreme and mid-range samples. A scale factor may be forwarded to a digital-to-analog converter for reconversion.

11 Claims, 3 Drawing Sheets

VIDEO LEVEL CONTROL

This is a continuation of application Ser. No. 917,158 filed Oct. 9, 1986 now abandoned.

FIELD OF THE INVENTION

The present invention concerns video signal processing, and more particularly to the conversion of such signals into digital form.

SUMMARY OF THE INVENTION

According to the present invention there is provided a digital video coder comprising a video input for receiving analogue video signals from a camera; an analog-to-digital converter connected to the input and having an output for digital words representing successive samples of the input signal and a control input for varying the sensitivity of the converter; and control means responsive to the digital words at the output of the converter to generate digitally, as a function of the amplitudes represented by previous digital words at the converter output, a control signal for application to the control input of the converter.

Other optional features are defined in claims 2 to 9 of the appended claims.

BRIEF DESCRIPTION OF THE DRAWINGS

One embodiment of the invention will now be described with reference to the accompanying drawings, in which.

DETAILED DESCRIPTION

Figure 1:
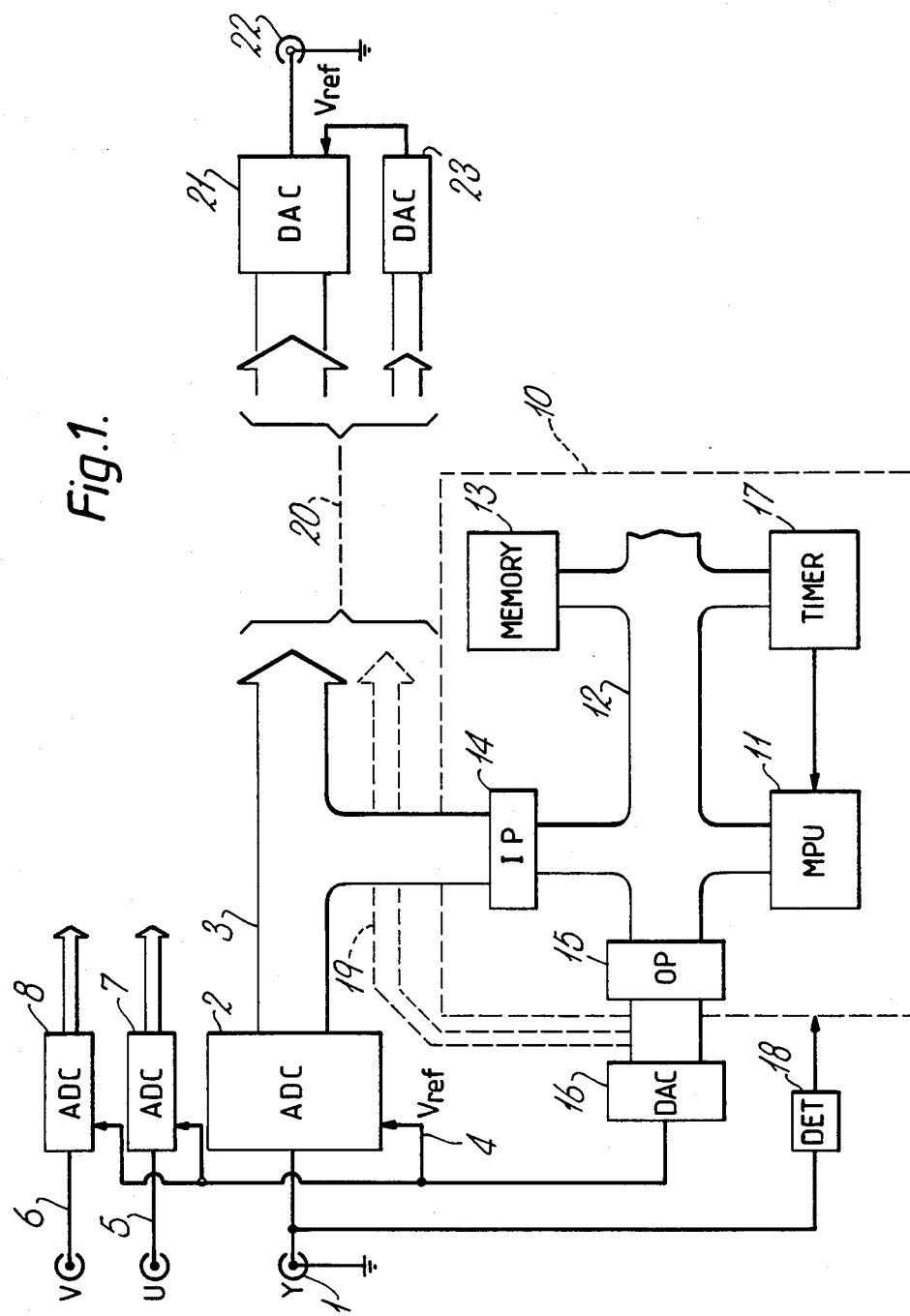
FIG. 1 is a block diagram of an apparatus according to the present invention.

The apparatus shown in FIG. 1 has a video input 1 connected to an analogue to digital converter 2 which produces 8-bit digital output samplts at an output 3. The converter 2 has a reference voltage input 4 which effectively controls the gain of the converter. If the input video is Vin and the reference voltage is Vref then the converter output X is given by X=255 Vin/Vref. Thus a reduction in Vref implies an increase in gain.

The video input is assumed to consist of non-composite video, but composite video could be coded provided that the gain control thresholds described below take account of the presence of synchronising pulses.

For a colour system, colour difference inputs 5,6, to analogue-to-digital converters 7,8 may be included; a single reference voltage Vref being used for these converters so that the gains of the colour difference channels accurately track that of the luminance channel. The system assumes the Y U V signal degradation is linear. This assumptions is quite valid as the effects of colour temperature changes are insignificant.

The reference voltage Vref is supplied by a feedback controller, indicated generally at 10, which latches samples from the digital output 3. The speed of operation of the controller is assumed to much slower than that required to process all samples, and it is arranged to take samples at an irregular rate so that over a period it takes cognisance of the luminance values over the entire picture area and makes, as necessary, adjustments to the reference voltage.

The controller 10 comprises a microprocessor 11, with associated data bus 12, and read-only memory and read-write memory indicated generally at 13. Address and control buses are of course present but not shown. Also connected to the data bus are an 8-bit input latch 14 connected to the converter output 3 and an 8-bit output latch 15 which supplies the output voltage Vref in digital form. The controller could, in practice be a single-chip microcomputer. The output Vref is converted to analogue form by a digital to analogue converter 16. This could simply consist of resistors connected to the digital outputs. An on-chip watchdog timer 17 is also incorporated to reset the microprocessor if it crashes or gets stuck in an illegal loop for longer than one field period (20 ms).

A loss of signal detector 18 resets the controller 10 to initial conditions (minimum gain) and holds it in this state until a video signal is applied.

Figure 2:
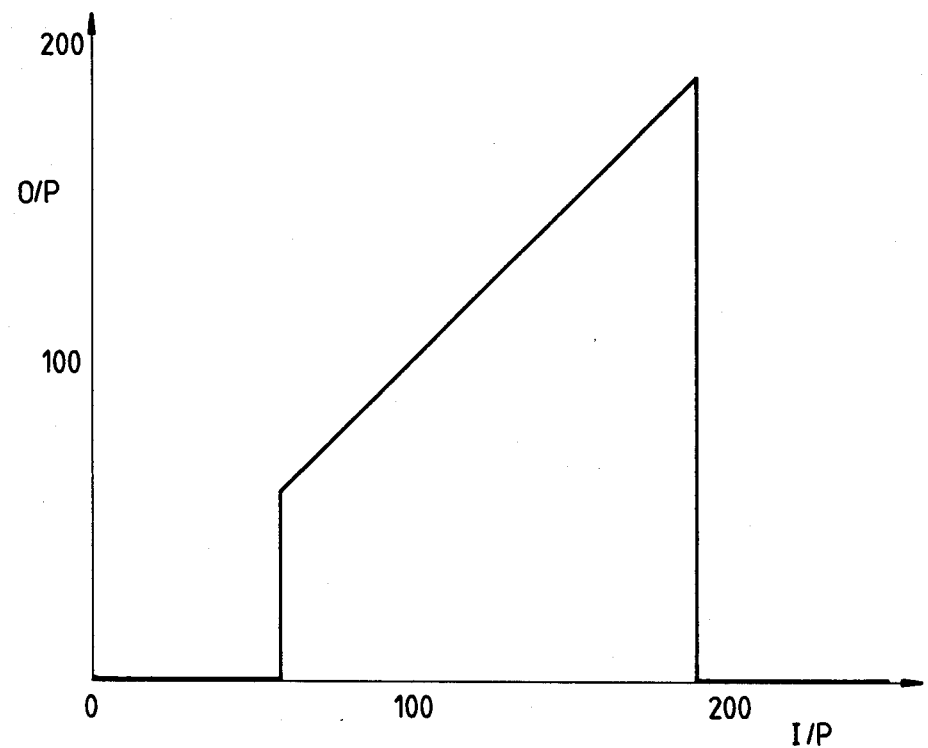
FIG. 2 illustrates graphically one possible control transfer function.

The function of the controller is to adjust the converter gain to compensate variations in video input amplitude. The aim is to maintain the grey level within a pre-determined range and thus samples representing video amplitudes below a lower threshold or above an upper threshold are, in principle, ignored (see FIG. 2). However, in order to avoid a lock-up state, if a significant number of samples keep falling outside the range the gain is adjusted accordingly to bring the samples back into range. In-range samples are accumulated and if the mean is not within the deemed grey-level range, an adjustment is made to Vref in proportion to the deviation.

Figure 3:
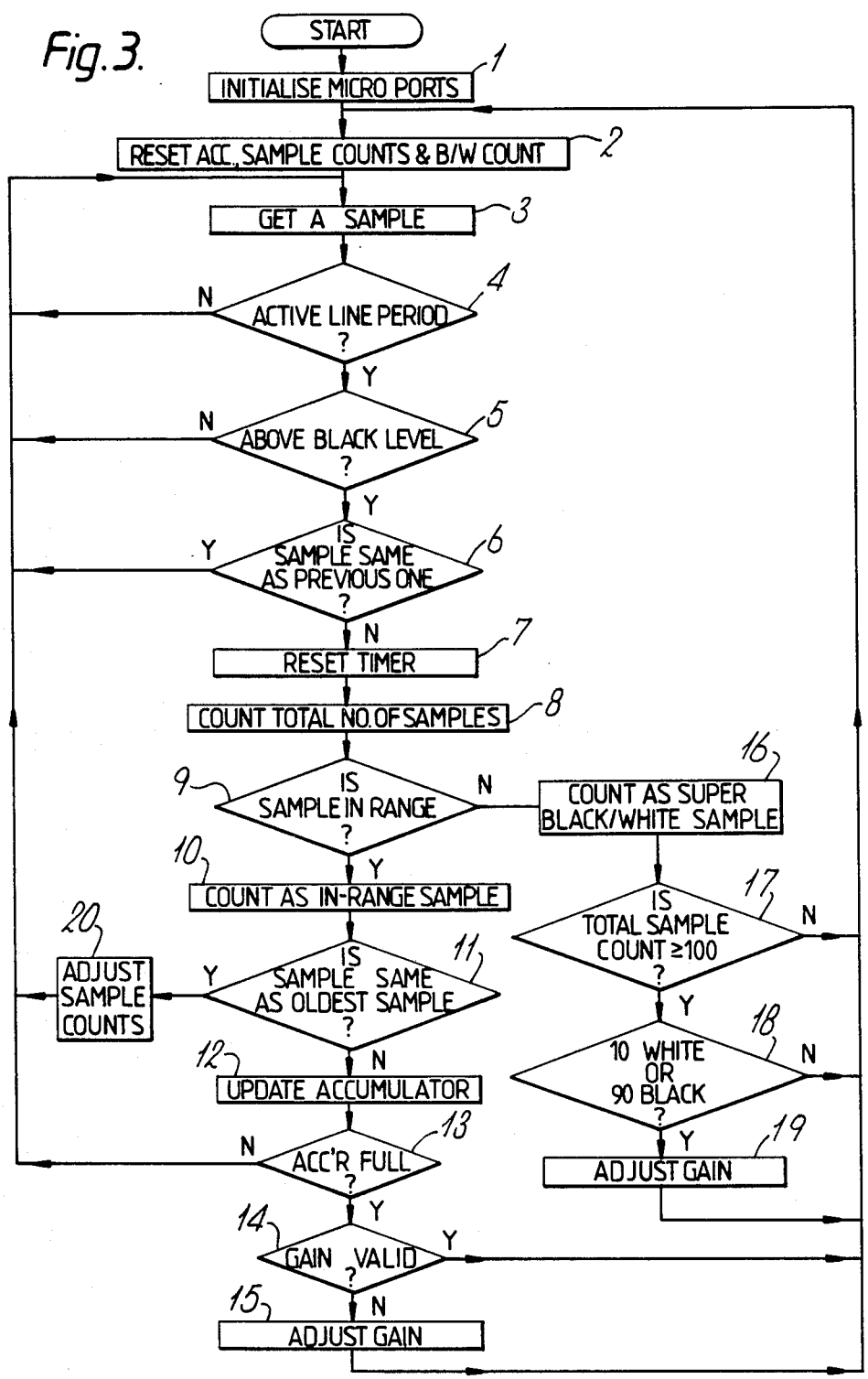
FIG. 3 is a flowchart.

A flowchart indicating controller operation is shown in FIG. 3. A brief description of the each step in the process is given below.

1 The microprocessor ports are initialised as inputs/outputs after reset, the gain is also set to minimum.
2 The accumulator, and counts, are reset.
3 A sample is latched.
4 The sample is accepted only if it were taken during the active line period.
6 It is discarged if it is same value as the previous one.
5 Or if it is at black level (zero amplitude).
7 The watchdog timer is reset, so that it does not normally reach its maximum count. If the maximum count is reached, a system fault is indicated and a reset to step 1 is initiated.
8 The sample count is incremented.
9 The samples are checked to ensure that they fall in the central range of FIG. 2. If not:
16 A count is incremented of "super white" or "super black" signals.
17 If the total sample cunt has not reached 100, return for a further sample, otherwise
18 If the count of super Whites is ten or more, or that of super Blacks is 90 or more, the reference voltage is adjusted (step 19) by one step (eg 10 mV on a 1 V nominal reference voltage) in the appropriate direction, and the cycle is repeated.
10 Otherwise the in-range sample count is incremented.
11 If the sample is the same as the first of the current accumulation, ignore it (resetting—step 20—the total sample count and in-range sample counts) and return for another sample.
12 The sample is added to an accumulator.
13 If the in-range sample count has not reached 100, return for a further sample.
14 If the accumulated total is not within ±15% of a target value (eg 50% of peak white, corresponding to a total of 127 times the in-range sample count) then the gain is adjusted by an amount proportional to the difference between the total and the target value.

Otherwise (2) the accumulator and "super white" and "super black" counts are reset and the cycle repeated. 15 The adjustment of the gain is carried out during the horizontal blanking period of the video signal so as to eliminate switching transients and noise from the display.

A typical system would be capable of processing on average about 500 samples per frame (compared with a total of about 520,000 samples per frame for a 25 fps signal sampled at 13 MHz.); the precise number depends on the signal content. As previously mentioned the rate of acquisition of samples by the controller 10 is irregular, the object being to ensure an effectively random subsampling so that the effect of all areas of the picture on the gain control is the same. This irregular sampling is achieved by the different paths seen on the flowchart, the processing taking different times to process in-range and out of range samples.

The system is transparent to all signals provided they are of the normally expected input level. Where variations occur, the signals are maintained to within (say) ten percent of their original amplitudes for 0 to 10 dB of attentuation.

The apparatus may be employed in digital picture coding: the dynamic range of the A/D converter is used optimally and hence quantisation errors are reduced to a minimum. Signal degradation (0 to 10 db) does not cause any appreciable loss in picture quality.

Another application is in security systems, whereby the effective sensitivity of normal cameras is increased to cope with very poor ambient light levels to produce good quality pictures.

It will be appreciated that in some circumstances, some clipping of the peak whites may occur; however in many applications this is considered acceptable.

If desired the gain change may be restored after processing (or storage or transmission). This is indicated schematically in FIG. 1 where the digital word representing Vref is fed as indicated at 19 along with the samples; after passage over a signal path 20 the samples and Vref word are separated, the former being supplied via a digital to analogue converter 21 to a video output 22 and the latter via a digital to analogue converter 23 to supply a Vref value to a control input of the converter 21.

In this situation, bit rate reduction may be possible by setting the analogue to digital converter to attenuate the video signal by some factor; this would then enable the same information to be transmitted using fewer bits and hence lower bit rates. The controller at the transmitting end would send the attentuation factor to the receiving end to compensate for this attentuation thereby returning the signal to its original amplitude.

We claim:

1. A digital video coder comprising a video input for receiving analogue video signals directly from a camera; an analogue-to-digital converter connected to the input and having an output for providing digital words representing successive samples of the input video signals and a control input for varying the sensitivity of the converter; and control means responsive to the digital words at the output of the converter to generate digitally, as a function of the average amplitude level represented by previous said digital words at the converter output, a control signal for application to the control input of the converter.

2. A digital video coder comprising a video input for receiving analogue video signals from a camera; an analogue-to-digital converter connected to the input and having an output for providing digital words representing successive samples of the input video signals and a control input for varying the sensitivity of the converter; and control means responsive to the digital words at the output of the converter to generate digitally, as a function of the amplitudes represented by the digital words at the converter output, a control signal for application to the control input of the converter, wherein such control means is arranged to subsample the words to select a minority of the words available at the said digital output, the rate of the sampling being irregular, whereby the selected words represent a random selection from the picture area represented by the video signals.

3. An apparatus according to claim 1 in which the control means includes means for sampling selected words and for accumulating a sum of a predetermined number of the selected words and to apply to the said control signal a correction proportional to the difference between the accumulated sum and a reference value.

4. An apparatus according to claim 3 in which the control means is arranged to apply the correction only if the accumulated sum differs from the reference value by more than a predetermined margin.

5. An apparatus according to claim 3 or 4 in which the control means is arranged to omit from the sum of any of the selected words whose value is equal to that of a previous one of the selected words.

6. An apparatus according to claim 3, or 4 in which the control means is arranged to omit from the sum any of the selected words whose value lies above a higher, or below a lower threshold value.

7. An apparatus according to claim 6 in which the control means is arranged to count the number of the selected words whose values lie respectively above and below the higher and lower threshold values during each accumulation period, and if the number of selected words whose values lie above said higher threshold value or the number of selected words whose value lies below said lower threshold value exceeds a respective predetermined number, to apply a correction to the said control signal.

8. An apparatus according to any one of the preceding claims 1, 2, 3 or 4 including further analogue-to-digital converters, having sensitivity control inputs controlled by the said control signal, for receiving colour-difference signals.

9. An apparatus for video processing, storage or transmission, comprising a processing apparatus having a video input for receiving analogue video signals from a camera; an analogue-to-digital converter connected to the input and having an output for providing digital words representing successive samples of the input video signals and a control input for varying the sensitivity of the converter; and control means responsive to the digital words at the output of the converter to generate digitally, as an function of the amplitudes represented by the digital words at the converter output, a control signal for application to the control input of the converter, and an output digital-to-analogue converter coupled to the output of said analogue-to-digital converter arranged for reconversion of the digital signals, following processing, storage or transmission, to an analogue signal, said control signal being delayed, stored or transmitted and being supplied to the output digital-to-analogue converter to control its sensitivity to correspond to that of the analogue to digital converter.

10. An apparatus for video processing, storage or transmission comprising a processing video coder apparatus according to claims 1, 2, 3, or 4 and an output digital-to analogue converter coupled to the output of said analogue-to-digital converter arranged for reconversion of the digital signals, following processing, storage or transmission, to an analogue signal, the said control signal being delayed, stored or transmitted and being supplied to the output digital-to-analogue converter to control its sensitivity to correspond to that of the analogue to digital converter.

11. A digital video coder comprising a video input for receiving analogue video signals directly from a camera; an analogue-to-digital converter connected to the input and having an output for providing digital words representing successive samples of the input video signals and a control input for varying the sensitivity of the converter; and control means responsive to the digital words at the output of the converter to generate digitally, as an arithmetic function of the amplitudes represented by the digital words at the converter output, a control signal for application to the control input of the converter for controlling the average level represented by said digital words by maintaining the average level of said digital words within a predetermined range.

* * * * *

(12) EX PARTE REEXAMINATION CERTIFICATE (9120th)
United States Patent
Azam et al.

(10) Number: US 4,860,103 C1
(45) Certificate Issued: Jul. 10, 2012

(54) VIDEO LEVEL CONTROL

(75) Inventors: Mohammad S. Azam, Ipswich (GB); Michael D. Carr, Ipswich (GB)

(73) Assignee: Princeton Digital Image Corporation, Longview, TX (US)

Reexamination Request:
No. 90/011,906, Sep. 14, 2011

Reexamination Certificate for:
Patent No.: 4,860,103
Issued: Aug. 22, 1989
Appl. No.: 07/275,658
Filed: Nov. 22, 1988

Related U.S. Application Data

(63) Continuation of application No. 06/917,158, filed on Oct. 9, 1986, now abandoned.

(30) Foreign Application Priority Data

Oct. 9, 1985 (GB) ............................................. 8524880

(51) Int. Cl.
H03M 1/18 (2006.01)
H04N 5/20 (2006.01)

(52) U.S. Cl. .................... 348/572; 348/678; 348/E5.073
(58) Field of Classification Search ......................... None
See application file for complete search history.

(56) References Cited

To view the complete listing of prior art documents cited during the proceeding for Reexamination Control Number 90/011,906, please refer to the USPTO's public Patent Application Information Retrieval (PAIR) system under the Display References tab.

Primary Examiner — Minh Dieu Nguyen

(57) ABSTRACT

An analog-to-digital converter 2 for video signals has a sensitivity (reference) input 4 controlled by a controller 10 in response to the converter's digital output so as to maintain the grey level with a predetermined range. Preferably the controller employs an irregular subsampling of the digital values, and responds differently to extreme and mid-range samples. A scale factor may be forwarded to a digital-to-analog converter for reconversion.

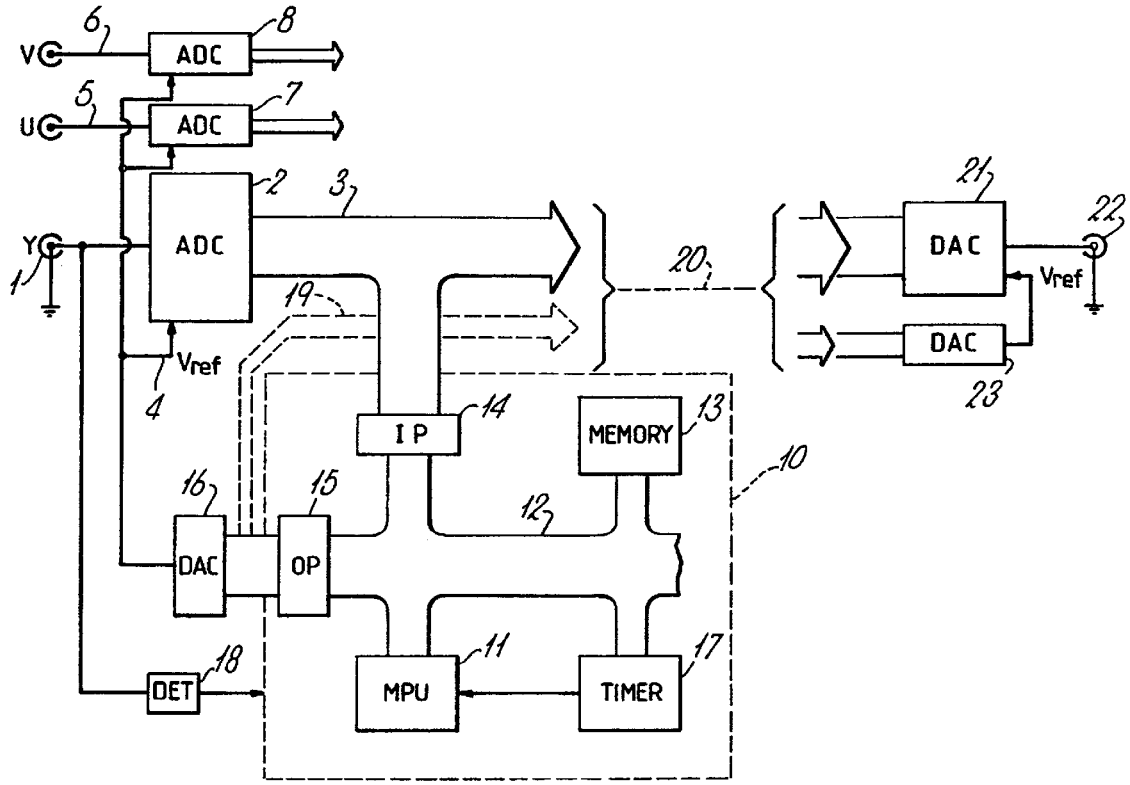

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1 and 11 is confirmed.

Claims 2-10 were not reexamined.

* * * * *